(12) United States Patent
Younis et al.

(10) Patent No.: US 6,809,676 B1
(45) Date of Patent: Oct. 26, 2004

(54) METHOD AND SYSTEM FOR VCO-BASED ANALOG-TO-DIGITAL CONVERSION (ADC)

(75) Inventors: Ahmed Younis, Austin, TX (US); Marwan M. Hassoun, Austin, TX (US); Moises E. Robinson, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/224,977

(22) Filed: Aug. 20, 2002

(51) Int. Cl.[7] .......................... H03M 1/60; H03D 3/24
(52) U.S. Cl. ........................................ 341/157; 375/375
(58) Field of Search ................................ 341/139, 142, 341/157, 161, 152, 166; 375/148, 316, 375, 376

(56) References Cited

U.S. PATENT DOCUMENTS

| | | | | |
|---|---|---|---|---|
| 5,005,016 A | * | 4/1991 | Schmidt et al. ............ | 341/142 |
| 5,189,420 A | * | 2/1993 | Eddy et al. ................ | 341/157 |
| RE34,899 E | * | 4/1995 | Gessaman et al. .......... | 341/157 |
| 5,511,100 A | * | 4/1996 | Lundberg et al. .......... | 375/376 |
| 5,671,252 A | * | 9/1997 | Kovacs et al. ............. | 375/316 |
| 5,796,358 A | * | 8/1998 | Shih et al. ................. | 341/139 |
| 6,192,094 B1 | * | 2/2001 | Herrmann et al. ......... | 375/375 |
| 6,278,725 B1 | * | 8/2001 | Rouphael et al. .......... | 375/148 |
| 6,677,879 B1 | * | 1/2004 | Nix et al. ................... | 341/161 |

* cited by examiner

Primary Examiner—Patrick Wamsley
(74) Attorney, Agent, or Firm—Pablo Meles; Timothy Markison

(57) ABSTRACT

A VCO (110) can be configured to convert an analog input signal (105) to a digital output signal (125). In accordance with the inventive arrangements, the VCO can convert the analog input signal to at least one intermediate signal (130) having a frequency dependent on the analog input signal. A frequency detector (115) can be configured to determine a frequency of at least one intermediate signal. Subsequently, a mapping circuit (120) can be configured to map the determined frequency of the at least one intermediate signal to an output value representing the digital output signal (125).

18 Claims, 2 Drawing Sheets

US 6,809,676 B1

METHOD AND SYSTEM FOR VCO-BASED ANALOG-TO-DIGITAL CONVERSION (ADC)

FIELD OF THE INVENTION

This invention relates generally to signal processing, and more particularly to a method and system for implementing a voltage controlled oscillator (VCO) based analog-to-digital converter (ADC).

BACKGROUND OF THE INVENTION

An analog-to-digital converter (ADC) converts an analog input signal to a digital output signal that is an approximation of the analog input signal. The resolution of an ADC defines the accuracy of the approximation between the digital output signal and the analog input signal. In this regard, the closer the resemblance between the digital output signal and the analog input signal, the greater the resolution of the ADC. ADCs are well known in the art and they can have various architectures. In general, each ADC architecture has specific characteristics that can make it suitable or unsuitable for a particular application.

One of the most popular ADC architectures is a pipeline ADC. Pipeline ADCs generally find application in systems operating at speeds of 10–200 MHz and requiring moderate resolution on the order of 10–14 bits. Their power consumption can be classified as being moderate when compared to other types of ADCs. A typical architecture of a pipeline ADC can include a plurality of consecutively coupled processing stages that can include a track-and-hold (T/H) circuit, and a summation circuit and amplification circuit coupled to each stage. A major drawback with pipeline ADC's involves latency occurring at various processing stages. For this and other reasons, pipeline ADCs are extremely sensitive to non-linearities affecting offset and gain.

Another popular ADC architecture is the sigma-delta ADC. The sigma-delta ADC typically finds application in systems processing signals at speeds of less than 20 MHz and requiring high resolution of the order of 12–24 bits. A typical sigma-delta ADC can include a comparator and several integrators having a feedback loop containing a 1-bit DAC. Notwithstanding, although sigma-delta ADCs can provide a higher resolution than pipeline ADCs, their application is limited by their speed.

Another popular ADC architecture is a flash ADC. Although flash ADCs can operate at speeds in excess of 1 GHz, power consumption is extremely high. Furthermore, their cost can be very high when compared to other ADCS.

Given these trade-offs and other inherent drawbacks, there is a need for a method and system for providing a more flexible ADC in terms of operating speed, power consumption, and cost.

SUMMARY OF THE INVENTION

The invention provides a method for converting an analog input signal to a digital output signal. The method can include converting the analog input signal to at least one intermediate signal having a frequency dependent on the analog input signal. A frequency of one or more intermediate signals can subsequently be determined. The determined frequency can be mapped to an output value that represents the digital output signal. The converting step can further include the step of converting a voltage of the analog input signal to an intermediate frequency dependent signal. In accordance with the invention, linearity of the digital output signal can be controlled by controlling the conversion of the voltage of the analog input signal to an intermediate frequency dependent signal. Notably, the resolution of the digital output signal can be controlled by controlling the determination of the frequency of one or more of the intermediate signals.

In another aspect of the invention, an analog-to-digital converter is provided. The ADC can be configured to convert an analog input signal to a digital output signal. The ADC can include a voltage controlled oscillator for converting the analog input signal to one or more intermediate signals having a frequency dependent on the magnitude of the analog input signal. At least one frequency detector can be coupled to the VCO for determining the frequency of one or more intermediate signals generated by the VCO. A mapping circuit can be configured to map the frequency of one or more intermediate signals to an output value. The output value can represent the digital output signal representative of the converted analog input signal.

Alternatively, a processor such as a digital signal processor or an FPGA can replace and perform the functions of the frequency detector and mapping circuit. The voltage controlled oscillator can include means for converting a voltage of the analog input signal to the intermediate signal, whose frequency is dependent on the magnitude of the analog input signal. The VCO can further include means for controlling a linearity of the ADC. Notably, the frequency detector can further include means for controlling a resolution of the ADC. One or more of the frequency detectors and the mapping circuit can be embodied in a digital signal processor (DSP) or an FPGA.

In another aspect of the invention, an analog-to-digital converter is provided for converting an analog input signal to a digital output signal. The ADC can include a voltage controlled oscillator for converting the analog input signal to one or more intermediate signals having a frequency dependent on the magnitude of the analog input signal. A processor can be configured to determine the frequency of one or more of the intermediate signals and map the frequency of the intermediate signal or signals to an output value. The output value can be representative of the digital output signal. The processor can be a DSP.

The VCO can include means for converting a voltage of the analog input signal to the intermediate signal, whose frequency is dependent on the voltage of the analog input signal. The VCO can further include means for controlling the linearity of the ADC. The frequency detector can further include means for controlling a resolution of the ADC.

In a further aspect of the invention, an analog-to-digital converter can be provided for converting an analog input signal to a digital output signal. The ADC can include means for converting an analog input signal to one or more intermediate signals having a frequency dependent on the magnitude of the analog input signal. A means can be provided for determining the frequency of one or more of the intermediate signals and for mapping one or more of the intermediate signals to an output value. The output value can be representative of the digital output signal.

DETAILED DESCRIPTION OF THE DRAWINGS

Figure 1:
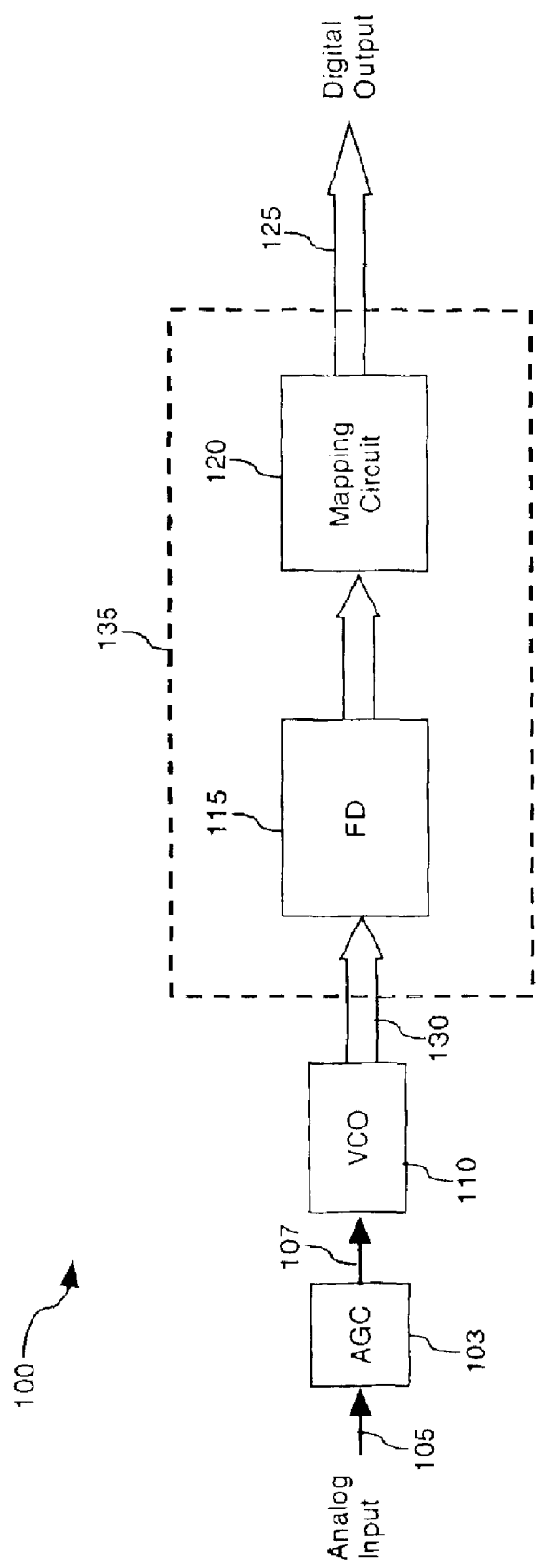
FIG. 1 is a block diagram of an exemplary VCO-based ADC in accordance with the inventive arrangements.

Referring to FIG. 1, there is shown a block diagram of an exemplary VCO-based ADC 100 in accordance with the inventive arrangements. The VCO-based ADC 100 can include an AGC 103 providing an output to a VCO 110 coupled to a frequency detector 115, and a mapping circuit 120 coupled to the output of the frequency detector 115.

VCOs such as VCO 110 are well known in the art. Notwithstanding, VCO 110 can receive an output signal 107 from AGC 103 and produce an output signal 130. For example, the analog input signal 105 can be a sinusoidal signal. In this regard, the analog input signal 105 can function as a control voltage for the VCO 110. The VCO 110 can generate one or more output clock signals 130 that can have the same frequency, but which can be time shifted. The frequency of the output clock signals 130 can be proportional to the magnitude of the analog input. For example, as the magnitude of the analog input signal 105 increases, the frequency of the VCO output signal 130 can increase. Also, as the magnitude of the analog input signal 105 decreases, the frequency of the VCO output signal 130 can decrease.

VCOs can be configured to generate a single output or multiple outputs having the same frequency. In a case where a VCO is configured to generate multiple outputs having the same frequency, their phases are usually shifted from each other by a constant value. Preferably, the phase shift can be equivalent to one period time divided by the number of outputs generated by the VCO. For example, where a VCO generates 20 outputs, each of the 20 outputs can be shifted in time by one period time divided by 20. This can be referred to as a 10-stage VCO.

Figure 2:
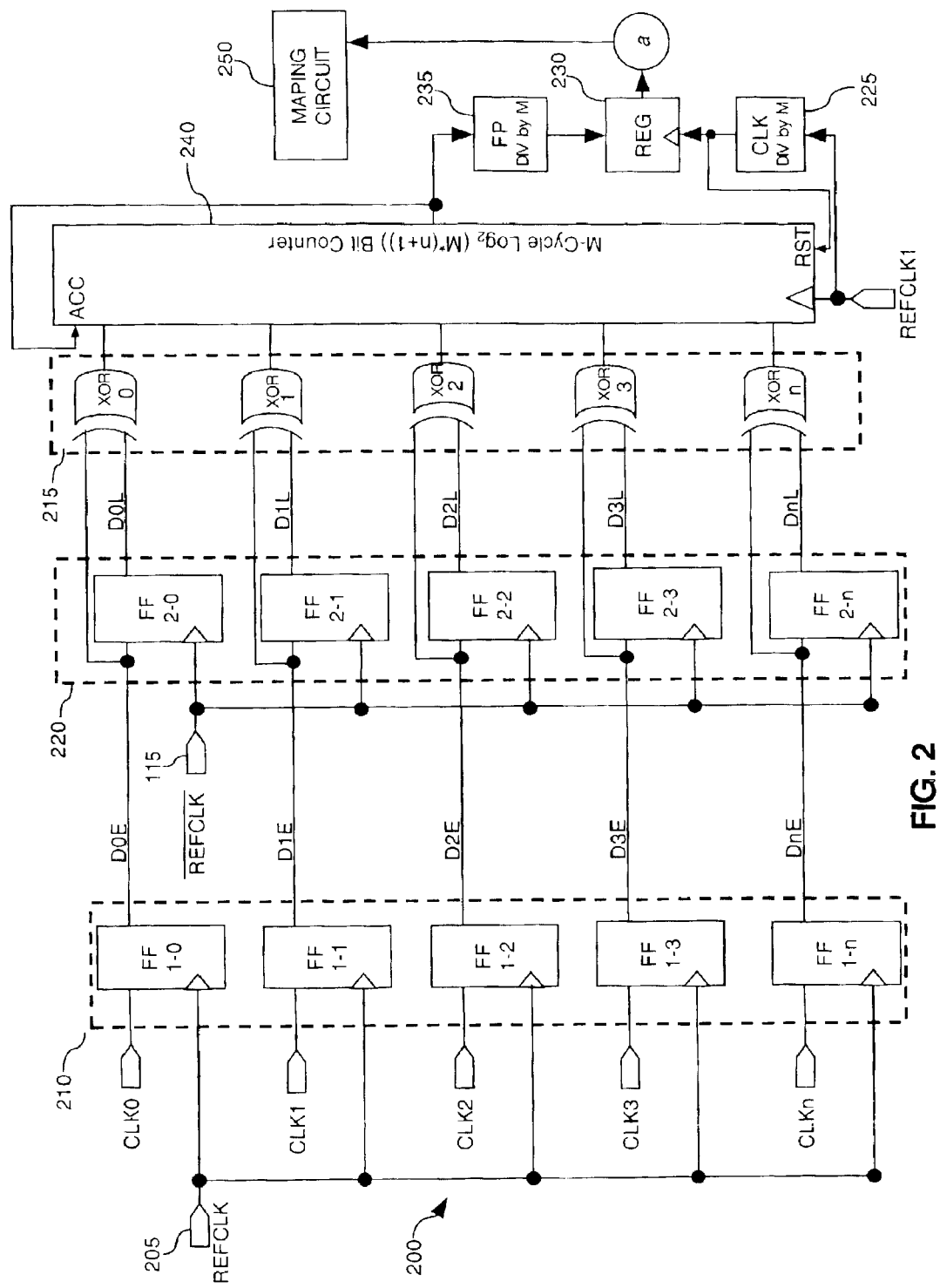
FIG. 2 is a block diagram of an exemplary frequency detection circuit in accordance with the inventive arrangements.

Frequency detector 115 can be configured to measure the frequency of an input signal 130. Notably, when coupled to the output of VCO 110, frequency detector 115 can determine the frequency of one or more VCO output signals 130. FIG. 2 depicts an exemplary frequency detection circuit 200 in accordance with the invention having a first bank of flip-flops 210 and a second bank of flip-flops 220. Each of the banks of flip-flops 210 and 220 can contain "n+1" flip-flops.

A reference clock signal (REFCLK) 205 can be coupled to a clock input of each of the "n+1" flip-flops located in the first bank of flip-flops 210. Notably, REFCLK signal 205 can be coupled to flip-flops 1-0, 1-1, 1-2, 1-3, . . . , 1-n. The complement or inverse of REFCLK signal 205, namely input signal 115, can be coupled to an input of each of the "n+1" flip-flops located in the second bank of flip-flops 220. Notably, input signal 115 can be coupled to flip-flops 2-0, 2-1, 2-2, 2-3, . . . , 2-n. Input signal 115 can be the complement of REFCLK 205. The flip-flops can preferably be D-type flip-flops although the invention is not limited in this regard.

Advantageously, a plurality of input clock signals can be used to achieve greater accuracy in determining the variation between an input clock signal and a reference clock signal. Each of the plurality of the input clock signals can have the same frequency and can be a shifted version of the input clock signal. Each input clock signal that is to be compared with the reference clock signal 205 can be singularly coupled to a flip-flop as shown. For example, input or VCO clock signal CLKO can be coupled to an input of the first flip-flop in the first bank of flip-flops 210, namely flip-flop FF 1-0. Similarly, clock signal CLK1 can be coupled to an input of the second flip-flop in the first bank of flip-flops 210, namely flip-flop FF 1-1. Finally, clock signal CLKn can be coupled to an input of the last flip-flop in the first bank of flip-flops, namely FF 1-n. It should readily be understood that "n" is a placeholder and is a positive whole number which can flexibly represent the number of flip-flops.

The output of each flip-flop in the first bank of flip-flops 210 can be coupled to the input of a corresponding flip-flop in the second bank of flip-flops 220 as shown. For example, the output of flip-flop FF 1-0, DOE, can be coupled to an input of flip-flop FF 2-0 and the output of flip-flop FF 1-1 can be coupled to an input of flip-flop FF 2-1. XOR gates or bank or XOR gates 215 can be coupled to the output of corresponding flip-flops to compare a currently sampled value with a previously sampled value of a particular clock signal. For example, a first input of a 2-input XOR gate can be coupled to output DOE of flip-flop FF 1-0 and a second input of the 2-input XOR gate can be coupled to output DOL of flip-flop FF 2-0 to determine changes in the sampled values of CLK0. The frequency detection circuit 200 can further include an adder 240 and other circuitry (230, 235, and 235) as shown to provide an output to a mapping circuit 250 similar to mapping circuit 120 of FIG. 1.

Notwithstanding, it should be recognized that FIG. 2 is an exemplary block diagram and the invention is not limited in this regard. Pending United States patent application, the assignee herein, entitled "Method and Circuit for Determining Frequency and Time Variations Between Electronic Signals," and which is filed concurrently herewith, provides a more exhaustive description of various embodiments of a frequency detector. This patent application is incorporated herein by reference. Importantly, it should be recognized by one skilled in the art that the present invention is not limited to the embodiments described herein. As such, any frequency detector can be utilized.

Referring once again to FIG. 1, mapping circuit 120 can be implemented as a lookup table or an algorithmic calculation and such circuits are well known in the art. In the lookup table implementation, mapping circuit 120 can include a memory for storing an electronic table. The electronic table can include entries that can facilitate conversion of a frequency value to a digital value representing the output 125 of the ADC 100. A frequency value received from the frequency detector can be converted to a digital value representing the output of ADC 100 that is equivalent to the digital representation of the magnitude of the analog input signal. In the algorithmic calculation method, the mapping circuit 120 can include a dedicated hardware, an FPGA and/or a general purpose DSP to execute different algorithms to calculate the digital equivalent of the magnitude of the analog input signal. In order to correctly calculate the digital equivalent of the magnitude of the analog input signal, these algorithms may need to do some calibration to the system or extract some parameters from VCO to be used in the calculations.

During operation of circuit 100, VC0 110 can receive as an input, an analog input signal 105. AGC 103 processes analog input signal 105 to provide signal 107. The VCO 110 can convert signal 107 to an output signal 130 having a frequency that is proportional to the magnitude of the analog input signal 105. The frequency detector 115 can determine the frequency of signal 130. A value representing the frequency of the signal 130 can be mapped to a digital output value by mapping circuit 120. Advantageously, the linearity of the VCO-based analog-to-digital converter 100 can be controlled by the linearity of the VCO, while the resolution of the VCO-based analog-to-digital converter 100 can be controlled by the frequency detector 115. Accordingly, the speed of the VCO 110 and the frequency detector 115 can govern the speed of the VCO-based analog-to-digital converter 100.

In light of the foregoing description of the invention, it should be recognized that the present invention can be realized in hardware, software, or a combination of hardware and software. A method and system for a VCO-based analog-to-digital converter according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein. In this regard, although the frequency detector 115 and the mapping circuit 120 are shown as separate entities, their functions can be implemented in a single digital signal processor 135 as shown in FIG. 1.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

The embodiments and architecture described above should give a circuit designer greater flexibility in designing ADCs where the variables of operating speed, power consumption and cost may be an issue. Using the VCO based ADC architecture described herein has the further advantage that it can easily be designed in a digital process.

Additionally, the description above is intended by way of example only and is not intended to limit the present invention in any way, except as set forth in the following claims.

What is claimed is:

1. A method for converting an analog input signal to a digital output signal, the method comprising:

converting the analog input signal to at least one intermediate signal having a frequency dependent on the analog input signal regardless of polarity;

determining said frequency of said at least one intermediate signal; and mapping said determined frequency of said at least one intermediate signal to an output value, said output value representing the digital output signal representative of the converted analog input signal.

2. The method according to claim 1, wherein said converting step further comprises converting a voltage of the analog input signal to said intermediate signal.

3. The method according to claim 2, further comprising controlling a linearity of the digital output signal by controlling said conversion of said voltage of said analog input signal to said intermediate signal.

4. The method according to claim 1, further comprising controlling a resolution of the digital output signal by controlling said determination of said frequency of said at least one intermediate signal.

5. An analog-to-digital converter for converting an analog input signal to a digital output signal, the analog-to-digital converter comprising:

a voltage controlled oscillator for converting the analog input signal to at least one intermediate signal having a frequency dependent on the analog input signal regardless of polarity;

at least one frequency detector for determining said frequency of said at least one intermediate signal; and a mapping circuit for mapping said frequency of said at least one intermediate signal to an output value, said output value representing the digital output signal representative of the converted analog input signal.

6. The analog-to-digital converter according to claim 5, wherein said voltage controlled oscillator further comprises means for converting a voltage of the analog input signal to said intermediate signal.

7. The analog-to-digital converter according to claim 6, wherein said voltage controlled oscillator further comprises means for controlling a linearity of the analog-to-digital converter.

8. The analog-to-digital converter according to claim 5, wherein said frequency detector further comprises means for controlling a resolution of the analog-to-digital converter.

9. The analog-to-digital converter according to claim 5, wherein the at least one frequency detector and the mapping circuit are embodied in a digital signal processor.

10. The analog-to-digital converter according to claim 5, wherein the mapping circuit is implemented using a lookup table.

11. The analog-to-digital converter according to claim 5, wherein the mapping circuit is implemented using an algorithmic calculation.

12. An analog-to-digital converter for converting an analog input signal to a digital output signal, the analog-to-digital converter comprising:

a voltage controlled oscillator for converting the analog input signal to at least one intermediate signal having a frequency dependent on the analog input signal regardless of polarity; and a processor for determining said frequency of said at least one intermediate signal and mapping said frequency of said at least one intermediate signal to an output value, said output value representing the digital output signal representative of the converted analog input signal.

13. The analog-to-digital converter according to claim 12, wherein said voltage controlled oscillator further comprises means for converting a voltage of the analog input signal to said intermediate signal.

14. The analog-to-digital converter according to claim 13, wherein said voltage controlled oscillator further comprises means for controlling a linearity of the analog-to-digital converter.

15. The analog-to-digital converter according to claim 12, wherein said frequency detector further comprises means for controlling a resolution of the analog-to-digital converter.

16. The analog-to-digital converter according to claim 12, wherein the processor is a digital signal processor.

17. An analog-to-digital converter for converting an analog input signal to a digital output signal, the analog-to-digital converter comprising:

means for converting the analog input signal to at least one intermediate signal having a frequency dependent on the analog input signal regardless of polarity; and means for determining said frequency of said at least one intermediate signal and mapping said frequency of said at least one intermediate signal to an output value, said output value representing the digital output signal representative of the converted analog input signal.

18. The analog-to-digital converter of claim 17, wherein the means for converting the analog input signal comprises an automatic gain control circuit.

* * * * *